United States Patent
Engelhardt

(10) Patent No.: US 8,877,610 B2
(45) Date of Patent: Nov. 4, 2014

(54) METHOD OF PATTERNING A SUBSTRATE

(75) Inventor: Manfred Engelhardt, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 612 days.

(21) Appl. No.: 13/163,792

(22) Filed: Jun. 20, 2011

(65) Prior Publication Data
US 2012/0322267 A1    Dec. 20, 2012

(51) Int. Cl.
| H01L 21/00 | (2006.01) |
| H01L 21/311 | (2006.01) |
| H01L 21/308 | (2006.01) |
| H01L 29/16 | (2006.01) |
| H01L 21/78 | (2006.01) |

(52) U.S. Cl.
CPC ........ *H01L 21/3081* (2013.01); *H01L 29/1608* (2013.01); *H01L 21/78* (2013.01)
USPC .................. 438/460; 438/700; 257/E21.252; 257/E21.487

(58) Field of Classification Search
CPC . H01L 21/78; H01L 21/3081; H01L 29/1608; H01L 21/02019; H01L 21/302; H01L 21/306; H01L 21/30604; H01L 21/3065; H01L 21/306055; H01L 21/308; H01L 21/3083; H01L 21/3085; H01L 21/3086; H01L 21/3088; H01L 21/31055
See application file for complete search history.

(56) References Cited

U.S. PATENT DOCUMENTS

| 5,964,942 A * | 10/1999 | Tanabe et al. | 117/87 |
| 2004/0034993 A1 * | 2/2004 | Rybka et al. | 29/623 |
| 2005/0266318 A1 * | 12/2005 | Shirai et al. | 430/5 |
| 2008/0128694 A1 * | 6/2008 | Arita et al. | 257/48 |
| 2010/0117188 A1 * | 5/2010 | Waldrab et al. | 257/506 |
| 2010/0289124 A1 * | 11/2010 | Nuzzo et al. | 257/618 |

FOREIGN PATENT DOCUMENTS

| CN | 1695095 A | 11/2005 |
| CN | 101226891 A | 7/2008 |
| CN | 101924173 A | 12/2010 |
| WO | 2004/031863 A1 | 4/2004 |

OTHER PUBLICATIONS

Office Action in the corresponding CN application No. 201210210886.3 mailed on Jul. 2, 2014.

* cited by examiner

*Primary Examiner* — Calvin Choi

(57) ABSTRACT

In various embodiments, a method of patterning a substrate may include: forming an auxiliary layer on or above a substrate and forming a plasma etch mask layer on or above the auxiliary layer, wherein the auxiliary layer is configured such that it may be removed from the substrate more easily than the plasma etch mask layer; patterning the plasma etch mask layer and the auxiliary layer such that at least a portion of the substrate is exposed; patterning the substrate by means of a plasma etch process using the patterned plasma etch mask layer as a plasma etch mask.

24 Claims, 7 Drawing Sheets

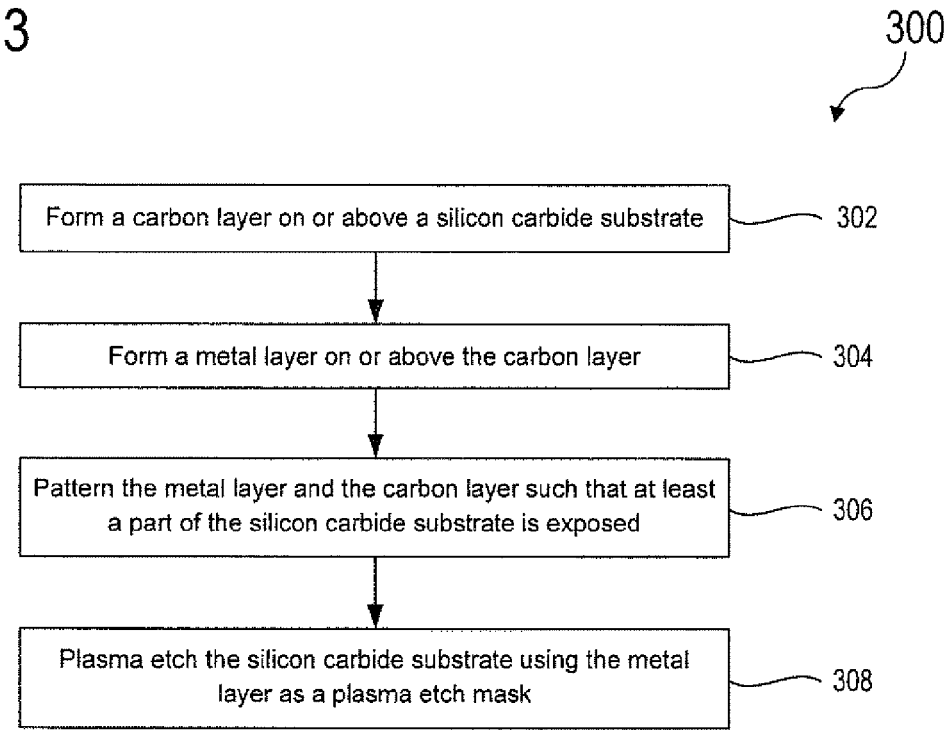
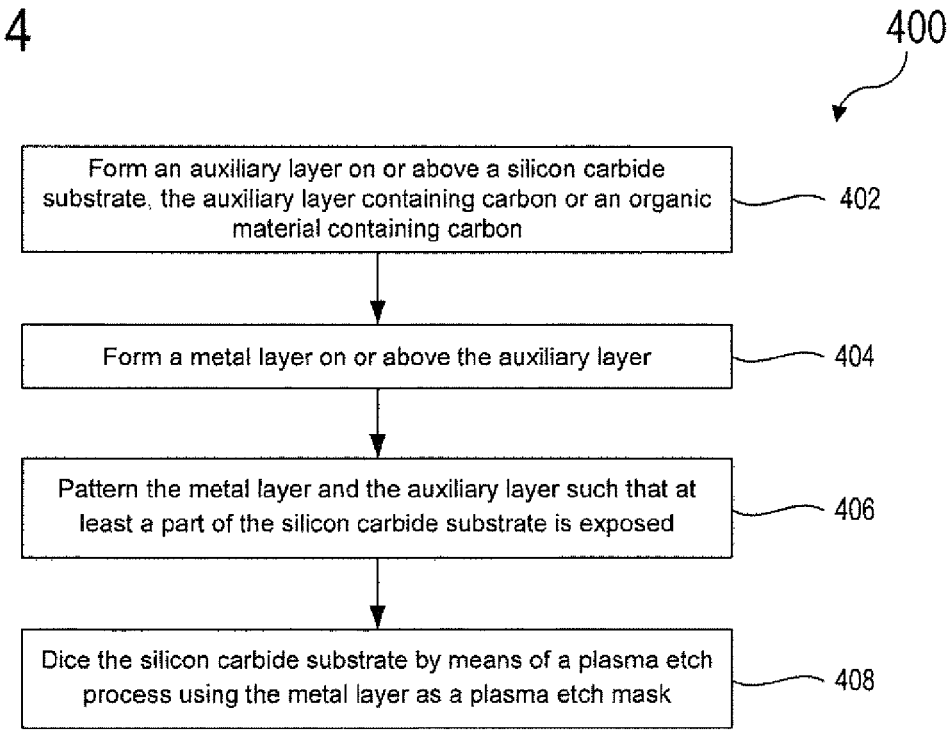

METHOD OF PATTERNING A SUBSTRATE

TECHNICAL FIELD

Various embodiments relate generally to a method of patterning a substrate.

BACKGROUND

Today, fabrication of semiconductor dies or chips commonly includes so-called dicing, i.e. singulation of the individual dies or chips from a substrate, typically a wafer substrate or, short, wafer. For various types of substrates, dicing may be achieved by means of mechanical sawing of the substrate. For some types of substrates such as e.g. silicon carbide (SiC) substrates, though, mechanical sawing of the substrate may be difficult and/or expensive due to the specific mechanical material properties of the substrate material (e.g. SiC). For example, mechanical sawing of the substrate may exhibit a low sawing speed and/or lead to high consumption of sawing blades in this case.

Furthermore, mechanical sawing of the substrate may lead to mechanical sawing damage such as e.g. formation of cracks, which may reach into the substrate and may impair or even destroy chip functionality. Also, mechanical sawing may result in a relatively wide kerf due to a given width of the sawing blade. These effects may be particularly prominent for very small chips, e.g. diodes, where a substantial amount of wafer surface area may be occupied by the kerf, as well as when larger wafer substrate diameters (e.g. diameters of 150 mm ("6 inch") and beyond) will be processed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a diagram illustrating a method of patterning a substrate in accordance with an embodiment;

FIG. 4 shows a diagram illustrating a method of plasma dicing a substrate in accordance with an embodiment;

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore is not to be taken in a limiting sense, and the scope of the present invention is defined by the appended claims.

Various embodiments are provided for devices, and various embodiments are provided for methods. It will be understood that basic properties of the devices also hold for the methods and vice versa. Therefore, for sake of brevity, duplicate description of such properties may be omitted.

The term "at least one" as used herein may be understood to include any integer number equal to or greater than one, i.e. "one", "two", "three", . . . , etc.

The term "a plurality" as used herein may be understood to include any integer number equal to or greater than two, i.e. "two", "three", "four", . . . , etc.

Unless otherwise indicated, the term "layer" as used herein may be understood to include embodiments where a layer is configured as a single layer, as well as embodiments where a layer is configured as a layer stack including a plurality of sublayers.

Today, fabrication of dies or chips from substrates (e.g. wafers) commonly includes a die singulation process, also referred to as dicing. For various types of substrates, dicing may be achieved by means of mechanical sawing of the substrate. For some types of substrate materials such as e.g. silicon carbide (SiC), mechanical sawing of the substrate may be difficult and/or expensive due to the specific mechanical material properties of the substrate material. For example, in case of SiC substrates, mechanical sawing of the substrate may exhibit a low sawing speed and/or lead to high consumption of sawing blades.

Furthermore, sawing of the substrate may lead to mechanical sawing damage such as e.g. formation of cracks, which may reach into the substrate and may impair or even destroy chip functionality. Also, mechanical sawing may result in a relatively wide kerf due to a given width of the sawing blade. These effects may be particularly prominent for very small chips, e.g. diodes, where a substantial amount of wafer surface area may be occupied by the kerf, as well as when larger wafer substrate diameters (e.g. diameters of 150 mm ("6 inch") and beyond) will be processed.

Figure 1:
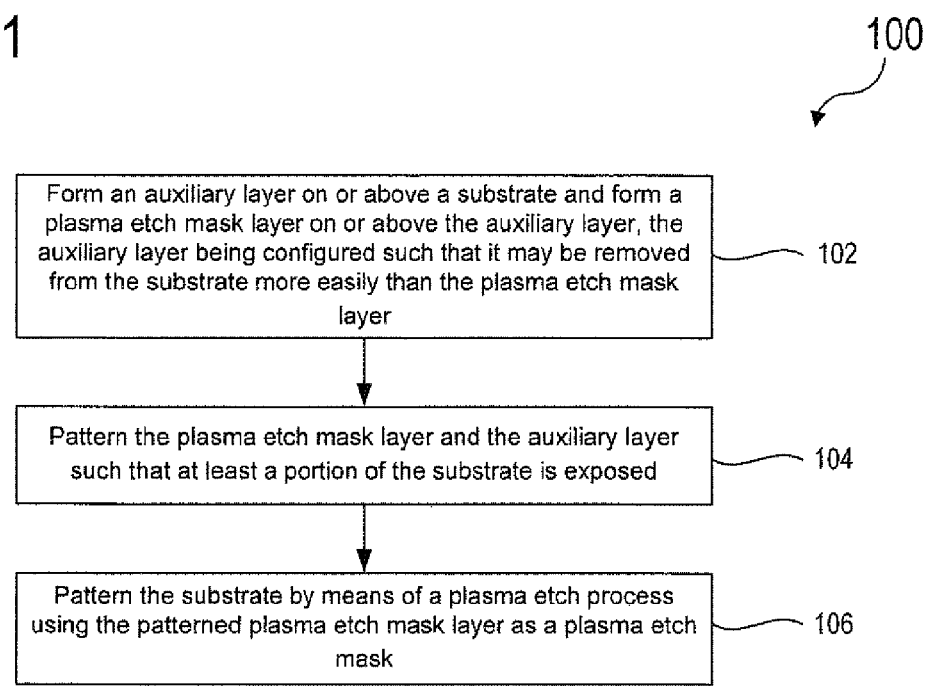
FIG. 1 shows a diagram illustrating a method of patterning a substrate in accordance with an embodiment.

FIG. 1 shows, in a diagram 100, a method of patterning a substrate in accordance with an embodiment.

In 102, an an auxiliary layer may be formed on or above a substrate and a plasma etch mask layer may be formed on or above the auxiliary layer. The auxiliary layer may be configured such that it may be removed from the substrate more easily than the plasma etch mask layer.

For example, in accordance with various embodiments, the plasma etch mask layer may contain or may be made of elements (e.g. metals or metal containing films) which, once in contact with the substrate material may give rise to a contamination risk which in turn may, for example, impair electrical chip performance and/or chip yield. It may also result in a chemical compound layer at the interface of the plasma etch mask layer and the substrate. This may even be promoted at elevated process temperatures and/or under ion bombardment during pattern transfer in the plasma. The latter may even result in implatation of elements contained in the mask material into the substrate. Various mask materials may also require the use of highly reactive/aggressive etch chemistries and/or elevated temperatures for mask layer removal after a substrate etching process. In accordance with various embodiments, the auxiliary layer (e.g. organic material) may be designed to be readily removable after the substrate etching process, e.g. together with the mask layer, by e.g. a lift-off process or other processes utilizing simple process chemistries (e.g. $O_2$, $N_2$, mixtures thereof, etc.) in plasma etch modules which may, for example, not have to be resistant against aggressive process etch chemistries (e.g. $Cl_2$, $BCl_3$, mixtures thereof, etc.) which may commonly be used for metal etching.

In 104, the plasma etch mask layer and the auxiliary layer may be patterned such that at least a portion of the substrate is exposed.

In 106, the substrate may be patterned by means of a plasma etch process using the patterned plasma etch mask layer as a plasma etch mask.

In accordance with various embodiments, the substrate may include or may be made of a wide band gap material, for example a material having a band gap of at least 1 eV, or a material having a band gap of at least 2 eV.

In accordance with various embodiments, the substrate may be one of the following substrates: a silicon carbide substrate, an aluminum oxide substrate (e.g. a sapphire substrate or a ruby substrate), a diamond substrate, a II-VI semiconductor substrate (e.g. a wide band gap II-VI semiconductor substrate), a III-V semiconductor substrate (e.g. a wide band gap III-V semiconductor substrate).

Herein, the term "silicon carbide substrate" may be understood to include substrates that are based on silicon carbide (SiC). This may include substrates that are made of silicon carbide, as well as substrates that include one or more layers containing silicon carbide or consisting of silicon carbide such as, for example, substrates including a silicon bulk layer and a silicon carbide layer (e.g. an epitaxially grown silicon carbide layer (also referred to as epitaxial or epi SiC layer)) disposed on or above the silicon bulk layer, or substrates including a silicon carbide bulk layer and an epitaxially grown silicon carbide layer (epi SiC layer) disposed on or above the silicon carbide bulk layer.

Similarly, the term "aluminum oxide substrate" may be understood to include substrates that are based on aluminum oxide ($Al_2O_3$). This may include substrates that are made of aluminum oxide, as well as substrates that include one or more layers containing aluminum oxide or consisting of aluminum oxide.

Similarly, the term "diamond substrate" may be understood to include substrates that are based on diamond. This may include substrates that are made of diamond, as well as substrates that include one or more layers containing diamond or consisting of diamond.

Similarly, the term "II-VI semiconductor substrate" may be understood to include substrates that are based on a II-VI semiconductor material. This may include substrates that are made of a II-VI semiconductor material, as well as substrates that include one or more layers containing a II-VI semiconductor material or consisting of a II-VI semiconductor material.

Similarly, the term "III-V semiconductor substrate" may be understood to include substrates that are based on a III-V semiconductor material. This may include substrates that are made of a III-V semiconductor material, as well as substrates that include one or more layers containing a III-V semiconductor material or consisting of a III-V semiconductor material.

In accordance with various embodiments, the substrate may be at least part of a wafer. For example, in accordance with one embodiment, the substrate may be a wafer.

In accordance with various embodiments, the substrate (e.g. wafer) may have a thickness in the micrometer range, for example on the order of several hundred micrometers in accordance with an embodiment, for example up to about 1000 µm in accordance with an embodiment. However, in accordance with other embodiments, the thickness may have a different value, e.g. larger than 1000 µm in accordance with an embodiment.

In accordance with various embodiments, the substrate may, for example, be mounted on a carrier (e.g. a wafer, a tape, or other suitable carrier).

In accordance with various embodiments, the auxiliary layer may contain or may be made of a material that may be removed from the substrate more easily than a material of the plasma etch mask layer.

In accordance with various embodiments, the auxiliary layer may contain or may be made of a material that may be removed from the substrate such that the substrate surface will be free from residues of the material of the auxiliary layer. In other words, the auxiliary layer or the material of the auxiliary layer may be removed from the substrate without leaving residues (of the material of the auxiliary layer) on the substrate surface. In still other words, the auxiliary layer or the material of the auxiliary layer may be configured such that removing the auxiliary layer or the material of the auxiliary layer from the substrate may lead to a residue-free substrate surface.

In accordance with various embodiments, the auxiliary layer may contain or may be made of carbon or an organic material containing carbon, for example an organic resist material (e.g. an organic photoresist material), an imide material (e.g. a polyimide material), or polytetrafluoroethylene (PTFE), alternatively other suitable organic materials containing carbon.

In accordance with another embodiment, the auxiliary layer may contain or may be made of a porous dielectric material, or a zeolite material.

In accordance with an embodiment, the auxiliary layer may include or may be a carbon layer.

In accordance with various embodiments, the auxiliary layer may be formed using a deposition process, for example a chemical vapor deposition (CVD) process, e.g. a plasma-enhanced chemical vapor deposition (PECVD) process, or a pyrolytic coating process. Alternatively or in addition, other suitable deposition processes may be used. In general, suitable deposition processes and corresponding operating conditions as such may be known in the art and may be chosen, for example, according to the material or materials to be deposited (i.e. the material or materials of the auxiliary layer in this case). In accordance with another embodiment, the auxiliary layer may even be a foil (containing or consisting of one or more of the materials mentioned above), which may be mounted onto the substrate.

In accordance with various embodiments, the auxiliary layer may have a layer thickness in the range from about 0.1 µm to about 100 µm. In accordance with other embodiments, the layer thickness may have a different value.

In accordance with various embodiments, forming the auxiliary layer on or above the substrate may include forming the auxiliary layer on or above a back side of the substrate (e.g. on or above a wafer back side). For example, in accordance with an embodiment the auxiliary layer may be coated on the back side of the substrate. In accordance with another embodiment, forming the auxiliary layer on or above the substrate may include forming the auxiliary layer on or above a front side of the substrate (e.g. on or above a wafer front side). For example, in accordance with an embodiment the auxiliary layer may be coated on the front side of the substrate.

In accordance with various embodiments, the plasma etch mask layer may contain or may be made of a material that has a high etch selectivity with respect to a material of the substrate. For example, in accordance with an embodiment, the plasma etch mask layer may contain or may be made of a material that has an etch selectivity of at least 10:1 with respect to a material of the substrate. In other words, the ratio between the etch rate of the material of the plasma etch mask layer and the etch rate of the material of the substrate may be 10:1 or higher.

In accordance with various embodiments, the plasma etch mask layer may contain metal, for example copper (Cu) and/or nickel (Ni).

For example, in accordance with an embodiment, the plasma etch mask layer may include or may be a metal layer, e.g. a copper layer and/or a nickel layer. In accordance with an embodiment, the plasma etch mask layer may be configured as a layer stack (also referred to as sandwich layer) including a plurality of sublayers. For example, in accordance with an embodiment the layer stack may include a copper sublayer and a nickel sublayer disposed on the copper sublayer. In accordance with other embodiments, the layer stack may be configured differently.

In accordance with various embodiments, the plasma etch mask layer may have a layer thickness in the range from about 0.1 µm to about 100 µm. In accordance with other embodiments, the layer thickness may have a different value.

In accordance with various embodiments, the plasma etch mask layer may be formed using a deposition process, for example a physical vapor deposition (PVD) process, e.g. a sputter deposition process), or a chemical vapor deposition (CVD) process, e.g. a metal-organic chemical vapor deposition (MOCVD) process, or an atomic layer deposition (ALD) process, or an electrochemical deposition (ECD) process onto a previously deposited seed layer or onto a previously deposited layer stack including or consisting of a seed layer and a bather film, or an electroless deposition process onto a previously deposited metal seed layer. Alternatively or in addition, other suitable deposition processes may be used. In general, suitable deposition processes and corresponding operating conditions as such may be known in the art and may be chosen, for example, according to the material or materials to be deposited (i.e. the material or materials of the plasma etch mask layer in this case).

In accordance with various embodiments, patterning the plasma etch mask layer and the auxiliary layer may include: forming a mask layer on or above the plasma etch mask layer; patterning the mask layer such that at least one portion of the plasma etch mask layer is exposed; removing the at least one exposed portion of the plasma etch mask layer such that at least one portion of the auxiliary layer is exposed; removing the at least one exposed portion of the auxiliary layer such that the at least one portion of the substrate is exposed; removing the patterned mask layer.

In accordance with another embodiment, patterning the plasma etch mask layer and the auxiliary layer may include: forming a mask layer on or above the plasma etch mask layer; patterning the mask layer such that at least one portion of the plasma etch mask layer is exposed; removing the at least one exposed portion of the plasma etch mask layer such that at least one portion of the auxiliary layer is exposed; removing the patterned mask layer; removing the at least one exposed portion of the auxiliary layer such that the at least one portion of the substrate is exposed.

In accordance with various embodiments, the mask layer may include or may consist of a resist material (e.g. a photoresist material). For example, in accordance with an embodiment the mask layer may be a resist layer, e.g. a photoresist layer. However, in accordance with other embodiments the mask layer may include or may be made of other suitable materials that may be patterned (e.g. imide, photoimide, etc.) and may serve as a mask.

In accordance with various embodiments, the mask layer may be formed by means of a suitable deposition process, for example a spin-coating process in accordance with an embodiment, although other deposition processes (e.g. spray coating, lamination of photoresist foils, etc.) may be used in accordance with other embodiments. In general, suitable deposition processes and corresponding operating conditions as such may be known in the art and may be chosen, for example, according to the material or materials to be deposited (i.e. the material or materials of the mask layer in this case).

In accordance with various embodiments, the mask layer may have a layer thickness in the range from about 0.1 µm to about 100 µm. In accordance with other embodiments, the layer thickness may have a different value.

In accordance with various embodiments, patterning the mask layer may be achieved by means of a lithographical (e.g. photolithographical) process including exposure and development, e.g. in case the mask layer is configured as a photoresist layer. In accordance with other embodiments, patterning the mask layer may be achieved using other suitable patterning processes. In general, suitable patterning processes and corresponding operating conditions as such may be known in the art and may be chosen, for example, according to the material or materials to be patterned (i.e. the material or materials of the mask layer in this case).

In accordance with various embodiments, removing the at least one exposed portion of the plasma etch mask layer may include or may be achieved by etching the at least one exposed portion of the plasma etch mask layer using the patterned mask layer as a mask.

Etching the at least one exposed portion of the plasma etch mask layer may be achieved by means of a suitable etch process, e.g. a wet etch process or a dry etch process (e.g. a plasma etch process), using suitable etch chemistry or etchants (e.g. a suitable etching solution, a suitable etching gas or mixture of etching gases for pattern transfer in a plasma). In general, suitable etch processes and corresponding operating conditions as such may be known in the art and may be chosen, for example, according to the material or materials to be etched (i.e. the material or materials of the plasma etch mask layer in this case).

In accordance with various embodiments, removing the at least one exposed portion of the auxiliary layer may include or may be achieved by etching the at least one exposed portion of the auxiliary layer using the patterned plasma etch mask layer (and, in accordance with an embodiment, the patterned mask layer) as a mask.

Etching the at least one exposed portion of the auxiliary layer may be achieved by means of a suitable etch process, for example a dry etch process (e.g. a plasma etch process) in accordance with an embodiment, using a suitable etchant or suitable etchants (e.g. a suitable etch gas or plasma). In general, suitable etch processes and corresponding operating conditions as such may be known in the art and may be chosen, for example, according to the material or materials to be etched (i.e. the material or materials of the auxiliary layer in this case).

In accordance with various embodiments, removing the patterned mask layer may include or may be achieved by means of etching the patterned mask layer.

Etching the patterned mask layer may be achieved by means of a suitable etch process, e.g. a wet etch process using suitable etch chemistry or a dry etch process, e.g. a plasma etch process (e.g. an ashing process) in accordance with an embodiment. In general, suitable etch processes and corresponding operating conditions as such may be known in the art and may be chosen, for example, according to the material or materials to be etched (i.e. the material or materials of the patterned mask layer in this case).

It has to be noted that in accordance with some embodiments, the patterned mask layer may be at least partially removed during an etch process used for patterning the plasma etch mask layer and/or later during an etch process (e.g. plasma etch process) used for patterning the auxiliary layer so that a dedicated removal step (e.g. dedicated etch step) may not be needed. For example, in accordance with one embodiment, the patterned mask layer may be fully consumed (and hence removed) during an etch process used for patterning the plasma etch mask layer. In other words, etching the plasma etch mask layer may result in the patterned plasma etch mask layer and, at the same, in the removal of the patterned mask layer in accordance with this embodiment. In accordance with another embodiment, the patterned mask layer may be fully consumed (and hence removed) during an etch process used for patterning the auxiliary layer. In other words, etching the auxiliary layer may result in the patterned auxiliry layer and, at the same, in the removal of the patterned mask layer in accordance with this embodiment.

In accordance with various embodiments, patterning the substrate by means of a plasma etch process may include or may be achieved by means of a suitable plasma etch process using e.g. a suitable plasma etchant or suitable plasma etchants (e.g. etch gas(es) or etch plasma(s)) and/or suitable operating conditions (e.g. suitable process chamber or reactor (e.g. ICP (inductively coupled plasma) reactor, ECR (electron cyclotron resonance) reactor, TCP (transformer coupled plasma) reactor, M0RI (M=0 resonant inductance) reactor, or other suitable process chamber or reactor), temperature, partial pressures of etch gases, high frequency or microwave frequency used for plasma ignition, etc.). For example, in accordance with an embodiment, one or more fluorine-based etchants such as e.g. $SF_6$, $CF_4$ or $NF_3$ may be used for etching, possibly in combination with addition of one or more process gases that may, for example, increase volatility of the etch products and/or have a sputter effect, such as e.g. oxygen ($O_2$) or argon (Ar). Alternatively or in addition, other process gases may be used, as will be readily understood by those skilled in the art. In general, suitable plasma etch processes and corresponding operating conditions as such may be known in the art and may be chosen, for example, according to the material or materials to be etched (i.e. the material or materials of the substrate in this case).

In accordance with various embodiments, patterning the substrate by means of a plasma etch process may include plasma etching the at least one exposed portion of the substrate. In other words, the at least one exposed portion of the substrate may be etched by means of the plasma etch process. Thus, a patterned substrate may be obtained.

In accordance with various embodiments, the exposed portion of the substrate may be at least partially removed by means of the plasma etch process. For example, in accordance with an embodiment, the exposed portion of the substrate may be partially removed such that e.g. a trench, a groove, a hole or a via is formed in the substrate, or, in accordance with another embodiment, the exposed portion of the substrate may be completely removed such that e.g. a hole or via leading from one side (e.g. back side) of the substrate to the other side (e.g. front side) of the substrate is formed in the substrate, or, in accordance with an embodiment such that the substrate is diced.

In accordance with various embodiments, patterning the substrate by means of the plasma etch process may include forming at least one of the following structures in the substrate: a trench, a groove, a hole, a via. In other words, the patterned substrate may include at least one trench and/or at least one groove and/or at least one hole and/or at least one via in accordance with various embodiments. For example, the at least one exposed portion of the substrate may be plasma etched such that at least one trench, and/or at least one groove and/or at least one hole and/or at least one via is formed in the substrate.

In accordance with various embodiments, a lateral dimension (e.g. a lateral diameter of a hole or via, or a lateral width of a trench or groove) of at least one of the structures formed in the substrate may be equal to or less than about 100 µm, for example in the range from about 1 µm to about 100 µm in accordance with an embodiment, for example in the range from about 1 µm to about 50 µm in accordance with an embodiment, for example in the range from about 1 µm to about 20 µm in accordance with an embodiment. In accordance with other embodiments, the lateral dimension may have a different value, e.g. greater than 100 µm in accordance with an embodiment or less than 1 µm in accordance with another embodiment.

In accordance with various embodiments, a vertical dimension (e.g. a depth of a hole or via, or of a trench or groove) of at least one of the structures formed in the substrate may have any value less than or equal to the thickness of the substrate.

In accordance with various embodiments, patterning the substrate by means of a plasma etch process may include dicing the substrate. That is, the patterned substrate (e.g. wafer) may include one or more singulated dies in accordance with various embodiments. For example, in accordance with an embodiment, the patterned substrate may correspond to or may be a diced wafer including a plurality of dies separated by one or more kerfs. Clearly, the substrate (e.g. wafer) may be plasma diced in accordance with some embodiments.

In accordance with various embodiments, at least one of the kerfs may have a kerf width equal to or less than about 100 µm, for example in the range from about 1 µm to about 100 µm in accordance with an embodiment, for example in the range from about 1 µm to about 50 µm in accordance with an embodiment, for example in the range from about 1 µm to about 20 µm in accordance with an embodiment. In accordance with other embodiments, the kerf width may have a different value, e.g. greater than 100 µm in accordance with an embodiment or less than 1 µm in accordance with an embodiment.

In accordance with various embodiments, the patterned plasma etch mask layer and the patterned auxiliary layer may be removed after patterning the substrate.

In accordance with various embodiments, the patterned plasma etch mask layer and the patterned auxiliary layer may be removed using separate (e.g. consecutive) process steps. That is, in accordance with various embodiments, first the patterned plasma etch mask layer (disposed on or above the patterned auxiliary layer), may be removed, and then the patterned auxiliary layer (disposed on or above the patterned substrate) may be removed.

In accordance with various embodiments, the patterned plasma etch mask layer may be removed using an etch process, for example a wet etch process or a dry etch process in accordance with an embodiment, for example a plasma etch process in accordance with an embodiment, alternatively other suitable etch processes may be used. In accordance with some embodiments, the patterned plasma etch mask may also be removed by combinations of wet etch and dry etch processes. In general, suitable etch processes and corresponding operating conditions as such may be known in the art and may be chosen, for example, according to the material or materials to be etched (i.e. the material or materials of the patterned plasma etch mask layer in this case).

In accordance with various embodiments, the patterned auxiliary layer may be removed using an etch process, for example a wet etch process or a dry etch process in accordance with an embodiment, for example a plasma etch process in accordance with an embodiment, alternatively other suitable etch processes may be used. In accordance with some embodiments, the patterned auxiliary layer may also be removed by combinations of wet etch and dry etch processes. In general, suitable etch processes and corresponding operating conditions as such may be known in the art and may be chosen, for example, according to the material or materials to be etched (i.e. the material or materials of the patterned auxiliary layer in this case). In this connection, it should be noted again that in accordance with various embodiments the auxiliary layer may be configured (e.g. contain or be made of a material) such that it may be removed from the substrate without leaving residues.

In accordance with various embodiments, the patterned plasma etch mask layer and the patterned auxiliary layer may be removed in a single process step, for example in a lift-off process step in accordance with an embodiment. In other words, in accordance with various embodiments, the patterned plasma etch mask layer and the patterned auxiliary layer may be removed simultaneously, for example by means of a lift-off process.

Figure 2:
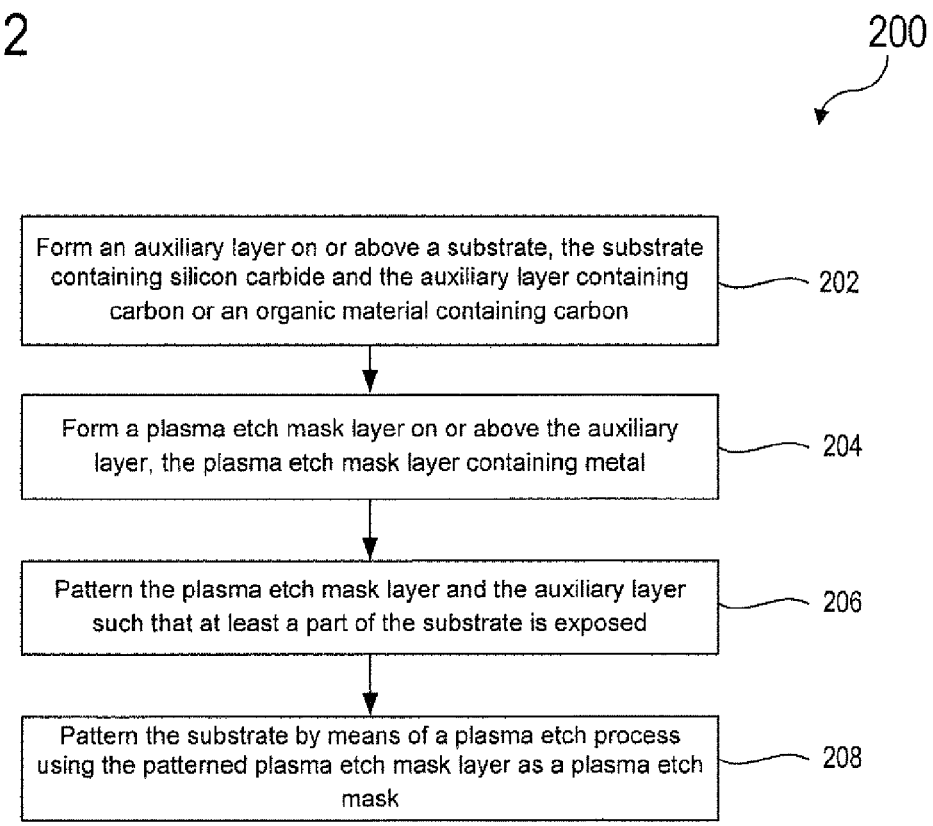
FIG. 2 shows a diagram illustrating a method of patterning a substrate in accordance with an embodiment.

FIG. 2 shows, in a diagram 200, a method of patterning a substrate in accordance with an embodiment.

In 202, an auxiliary layer may be formed on or above a substrate. The substrate may contain silicon carbide. The auxiliary layer may contain carbon or an organic material containing carbon.

The substrate may, for example, be further configured in accordance with one or more embodiments described herein.

The auxiliary layer may, for example, be further configured in accordance with one or more embodiments described herein.

Forming the auxiliary layer may, for example, further be carried out in accordance with one or more embodiments described herein.

In 204, a plasma etch mask layer may be formed on or above the auxiliary layer. The plasma etch mask layer may contain metal.

The plasma etch mask layer may, for example, be further configured in accordance with one or more embodiments described herein.

Forming the plasma etch mask layer may, for example, further be carried out in accordance with one or more embodiments described herein.

In 206, the plasma etch mask layer and the auxiliary layer may be patterned such that at least a part of the substrate is exposed.

Patterning the plasma etch mask layer and the auxiliary layer may, for example, further be carried out in accordance with one or more embodiments described herein.

In 208, the substrate may be patterned by means of a plasma etch process using the patterned plasma etch mask layer as a plasma etch mask.

Patterning the substrate may, for example, further be carried out in accordance with one or more embodiments described herein.

In accordance with various embodiments, the plasma etch mask layer and the auxiliary layer may be removed after patterning the substrate.

Removing the plasma etch mask layer and the auxiliary layer may, for example, further be carried out in accordance with one or more embodiments described herein.

FIG. 3 shows, in a diagram 300, a method of patterning a substrate in accordance with an embodiment.

In 302, a carbon layer may be formed (e.g. deposited) on or above a silicon carbide substrate.

The carbon layer may serve as an auxiliary layer for patterning the silicon carbide substrate. Forming the carbon layer (auxiliary layer) may, for example, further be carried out in accordance with one or more embodiments described herein.

In accordance with various embodiments, the silicon carbide substrate may, for example, be further configured in accordance with one or more embodiments described herein.

In 304, a metal layer may be formed on or above the carbon layer.

The metal layer may serve as a plasma etch mask layer in a plasma etch process used for patterning the silicon carbide substrate.

The metal layer (plasma etch mask layer) may, for example, be further configured in accordance with one or more embodiments described herein.

Forming the metal layer (plasma etch mask layer) may, for example, further be carried out in accordance with one or more embodiments described herein.

In 306, the metal layer (plasma etch mask layer) and the carbon layer (auxiliary layer) may be patterned such that at least a part of the silicon carbide substrate is exposed.

Patterning the metal layer (plasma etch mask layer) and the carbon layer (auxiliary layer) may, for example, further be carried out in accordance with one or more embodiments described herein.

In 308, the silicon carbide substrate may be plasma etched (in other words, by means of a plasma etch process) using the patterned metal layer as a plasma etch mask.

By means of the plasma etching, the silicon carbide substrate may be patterned, for example diced.

In accordance with various embodiments, the patterned metal layer and the patterned carbon layer may be removed after the plasma etching.

Removing the patterned metal layer and the patterned carbon layer may, for example, be carried out in accordance with one or more embodiments described herein, for example in separate process steps in accordance with an embodiment, or in a single process step (e.g. lift-off process step) in accordance with another embodiment.

FIG. 4 shows, in a diagram 400, a method of plasma dicing a substrate in accordance with an embodiment.

In 402, an auxiliary layer may be formed on or above a silicon carbide substrate, the auxiliary layer containing carbon or an organic material containing carbon.

The substrate may, for example, be further configured in accordance with one or more embodiments described herein.

The auxiliary layer may, for example, be further configured in accordance with one or more embodiments described herein.

Forming the auxiliary layer may, for example, further be carried out in accordance with one or more embodiments described herein.

In 404, a metal layer may be formed on or above the auxiliary layer.

The metal layer may serve as a plasma etch mask layer in a plasma etch process used for dicing the substrate.

The metal layer may, for example, be further configured in accordance with one or more embodiments described herein.

Forming the metal layer may, for example, further be carried out in accordance with one or embodiments described herein.

In 406, the metal layer and the auxiliary layer may be patterned such that at least a part of the silicon carbide substrate is exposed.

Patterning the metal layer and the auxiliary layer may, for example, further be carried out in accordance with one or more embodiments described herein.

In 408, the silicon carbide substrate may be diced by means of a plasma etch process using the metal layer as a plasma etch mask.

The dicing or plasma etch process may, for example, be further configured in accordance with one or more embodiments described herein.

In accordance with various embodiments, the metal layer and the auxiliary layer may be removed after the dicing.

Removing the metal layer and the auxiliary layer may, for example, be carried out in accordance with one or more embodiments described herein.

In accordance with another embodiment, a patterned substrate (e.g. wafer) may be provided that may include one or more patterns obtained by a method of patterning a substrate in accordance with one or more embodiments described herein. For example, the patterned substrate may include one or more patterns or structures such as, for example, trenches, grooves, holes or vias. In accordance with some embodiments, a lateral dimension (e.g. a lateral diameter of a hole or via, or a lateral width of a trench or groove) of at least one of the patterns or structures may be equal to or less than about 100 µm, for example in the range from about 1 µm to about 100 µm in accordance with an embodiment. In accordance with some embodiments, the patterned substrate may include or may be a diced wafer including one or more dies separated by one or more kerfs having, for example, a kerf width equal to or less than about 100 µm, for example in the range from about 1 µm to about 100 µm in accordance with an embodiment. The patterned substrate may be further configured in accordance with one or more embodiments described herein.

FIG. 5A to FIG. 5K show schematic cross-sectional views illustrating a method of patterning a substrate in accordance with an embodiment.

Figure 5A:
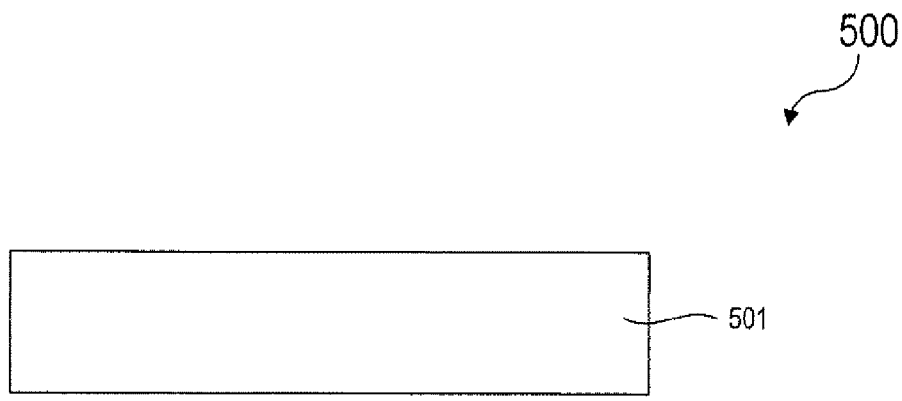
FIG. 5A to FIG. 5K show schematic cross-sectional views illustrating a method of patterning a substrate in accordance with an embodiment.

FIG. 5A shows, in a view 500, that a substrate 501 may be provided.

In accordance with an embodiment, the substrate 501 may be a silicon carbide (SiC) substrate. In accordance with other embodiments, the substrate 501 may include or may be made of other materials as described herein for example in connection with FIG. 1. For example, the substrate 501 may include or may be made of a wide band gap material, for example a material having a band gap of at least 1 eV in accordance with an embodiment, or a material having a band gap of at least 2 eV in accordance with another embodiment.

In accordance with various embodiments, the substrate 501 may be a wafer or may be part of a wafer (only a part of the wafer may be shown in FIG. 5A).

In accordance with various embodiments, the substrate 501 may be mounted on a carrier (e.g. a wafer, a tape, or other suitable carrier).

In accordance with various embodiments, the substrate 501 (e.g. wafer) may have a thickness in the micrometer range, for example on the order of several hundred micrometers in accordance with an embodiment, for example up to about 1000 µm in accordance with an embodiment. However, in accordance with other embodiments, the thickness of the substrate 501 may have a different value, e.g. larger than 1000 µm in accordance with an embodiment.

Figure 5B:
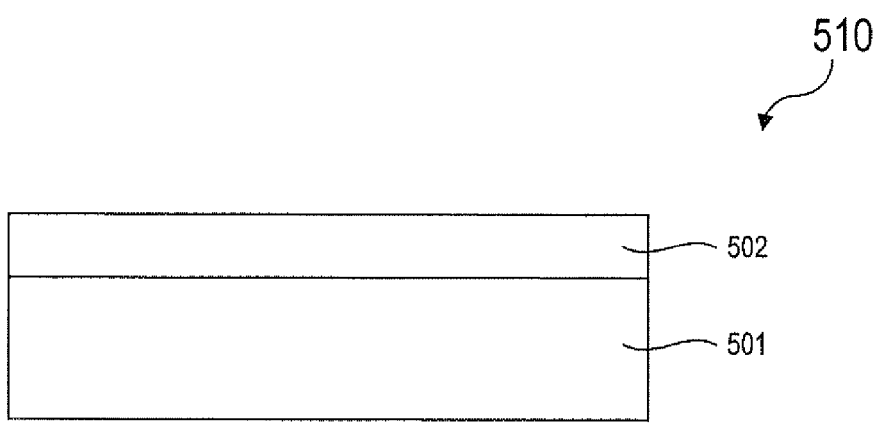

FIG. 5B shows, in a view 510, that an auxiliary layer 502 may be formed on the substrate 501.

In accordance with various embodiments, the auxiliary layer 502 may contain or may be made of a material that may be removed from the substrate 501 more easily than a material of a plasma etch mask layer 503 to be formed later (see below). For example, the auxiliary layer 502 may contain or may be made of a material that may be removed from the substrate 501 without leaving residues on the substrate 501.

For example, in accordance with some embodiments, the auxiliary layer 502 may contain carbon or an organic material containing carbon (e.g. an organic resist material, an imide material or PTFE). For example, in accordance with one embodiment, the auxiliary layer 502 may be a carbon layer. In accordance with other embodiments, the auxiliary layer 502 may contain or may be made of other suitable materials that may be removed easily (and/or without leaving residues) from the substrate 501, for example a porous dielectric material or a zeolite material in accordance with some embodiments.

In accordance with various embodiments, the auxiliary layer 502 may be formed by means of a deposition process, for example a chemical vapor deposition (CVD) process, e.g. a plasma-enhanced CVD process, or a pyrolytic coating process, alternatively other suitable deposition processes. In general, suitable deposition processes and corresponding operating conditions as such may be known in the art and may be chosen, for example, according to the material or materials to be deposited (i.e. the material or materials of the auxiliary layer 502 in this case).

In accordance with various embodiments, the auxiliary layer 502 may have a layer thickness in the range from about 0.1 µm to about 100 µm. In accordance with other embodiments, the layer thickness may have a different value.

Figure 5C:
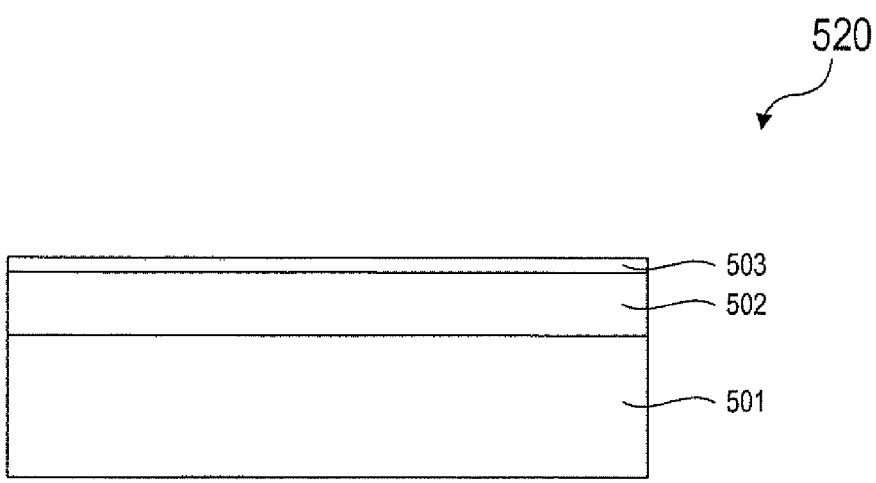
Figure 5D:
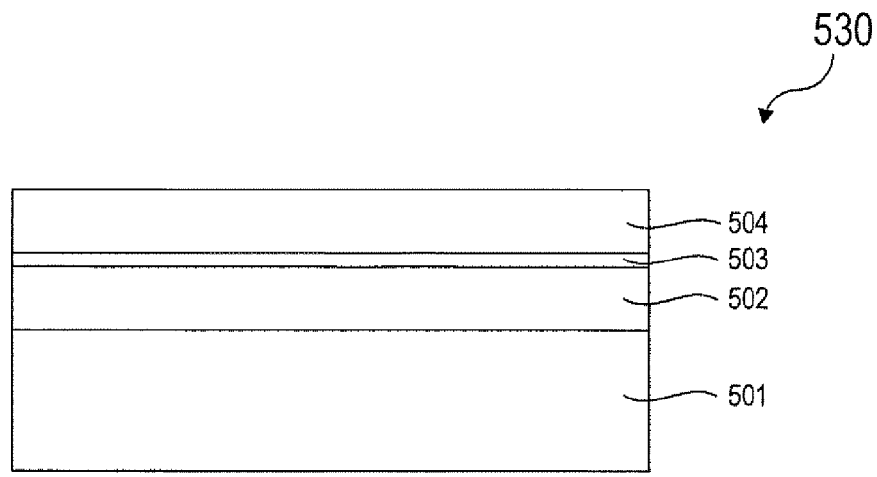

FIG. 5C shows, in a view 520, that a plasma etch mask layer 503 may be formed on the auxiliary layer 502.

The plasma etch mask layer 503 may serve as an etch mask during a plasma etch process used for patterning the substrate 501, as described below.

In accordance with various embodiments, the plasma etch mask layer 503 may contain or may be made of a material that has a high etch selectivity with respect to the substrate material, for example an etch selectivity of at least 10:1 with respect to the substrate material in accordance with an embodiment.

In accordance with various embodiments, the plasma etch mask layer 503 may be a metal layer, e.g. a copper (Cu) layer, a nickel (Ni) layer, a Ni/Cu sandwich layer (i.e. a layer stack including a Ni sublayer disposed on a Cu sublayer) or other metal layer in accordance with some embodiments. In accordance with other embodiments, the plasma etch mask layer 503 may contain or may be made of other suitable mask materials.

In accordance with various embodiments, the plasma etch mask layer 503 may be formed by means of a deposition process, for example a chemical vapor deposition (CVD) process, e.g. a metal-organic chemical vapor deposition (MOCVD) process, or an atomic layer deposition (ALD) process in accordance with an embodiment, alternatively other suitable deposition processes. In general, suitable deposition processes and corresponding operating conditions as such may be known in the art and may be chosen, for example, according to the material or materials to be deposited (i.e. the material or materials of the plasma etch mask layer 503 in this case).

In accordance with various embodiments, the plasma etch mask layer 503 may have a layer thickness in the range from about 0.1 μm to about 100 μm. In accordance with other embodiments, the layer thickness may have a different value.

The plasma etch mask layer 503 and the auxiliary layer 502 may be patterned such that a portion of the substrate 501 is exposed, as will be described herein below with reference to FIG. 5D to FIG. 5H FIG. 5D shows, in a view 530, that a mask layer 504 may be formed on the plasma etch mask layer 503.

In accordance with various embodiments, the mask layer 504 may include or may consist of a resist material (e.g. a photoresist material). For example, in accordance with an embodiment the mask layer 504 may be a resist layer, e.g. a photoresist layer. In accordance with other embodiments the mask layer 504 may include or may be made of other suitable materials that may be patterned and may serve as a mask.

In accordance with various embodiments, the mask layer 504 may be formed by means of a suitable deposition process, for example a spin-coating process in accordance with an embodiment, although other deposition processes may be used in accordance with other embodiments. In general, suitable deposition processes and corresponding operating conditions as such may be known in the art and may be chosen, for example, according to the material or materials to be deposited (i.e. the material or materials of the mask layer 504 in this case).

In accordance with various embodiments, the mask layer 504 may have a layer thickness in the range from about 0.1 μm to about 100 μm. In accordance with other embodiments, the layer thickness may have a different value.

Figure 5E:
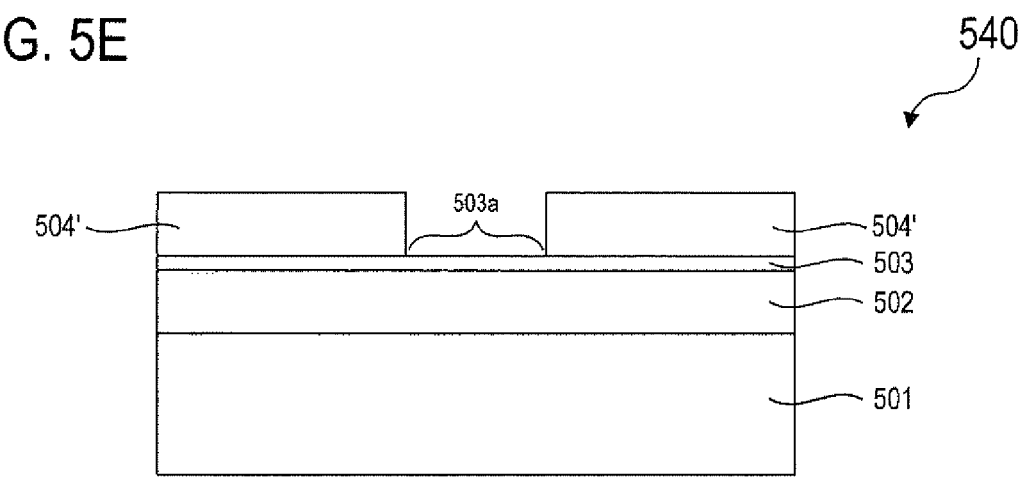

FIG. 5E shows, in a view 540, that the mask layer 504 may be patterned such that a portion 503a of the plasma etch mask layer 503 is exposed. In addition to the portion 503a shown in FIG. 5E, at least one additional portion of the plasma etch mask layer 503 may be exposed in accordance with some embodiments (not shown).

In accordance with various embodiments, patterning the mask layer 504 may be achieved by means of a lithographical (e.g. photolithographical) process including exposure and development, e.g. in case the mask layer 504 is configured as a photoresist layer. In accordance with other embodiments, patterning the mask layer 504 may be achieved using other suitable patterning processes. In general, suitable patterning processes and corresponding operating conditions as such may be known in the art and may be chosen, for example, according to the material or materials to be patterned (i.e. the material or materials of the mask layer 504 in this case).

As shown, patterning the mask layer 504 may result in a patterned mask layer 504'.

Figure 5F:
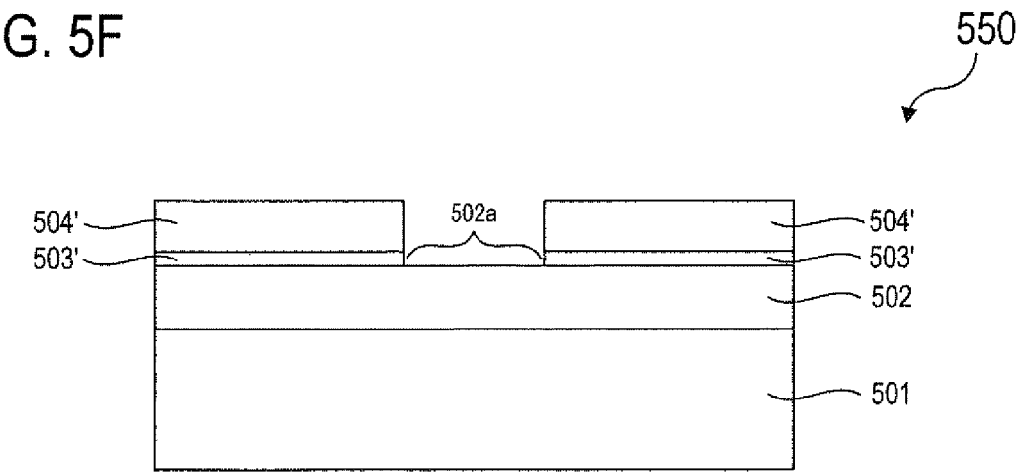

FIG. 5F shows, in a view 550, that the exposed portion 503a of the plasma etch mask layer 503 may be removed such that a portion 502a of the auxiliary layer 502 is exposed. In addition to the portion 502a shown in FIG. 5F, at least one additional portion of the auxiliary layer 502 may be exposed in accordance with some embodiments (not shown).

In accordance with various embodiments, removing the exposed portion 503a of the plasma etch mask layer 503 may include or may be achieved by etching the exposed portion 503a of the plasma etch mask layer 503 using the patterned mask layer 504' as a mask.

Etching the exposed portion 503a of the plasma etch mask layer 503 may be achieved by means of a suitable etch process, e.g. a wet etch process or a dry etch process (e.g. a plasma etch process), using suitable etch chemistry or etchants (e.g. a suitable etch gas or plasma). In general, suitable etch processes and corresponding operating conditions as such may be known in the art and may be chosen, for example, according to the material or materials to be etched (i.e. the material or materials of the plasma etch mask layer 503 in this case).

As shown, removing the exposed portion 503a of the plasma etch mask layer 503 may result in a layer stack including a patterned plasma etch mask layer 503' and the patterned mask layer 504' disposed on the patterned plasma etch mask layer 503'.

Figure 5G:
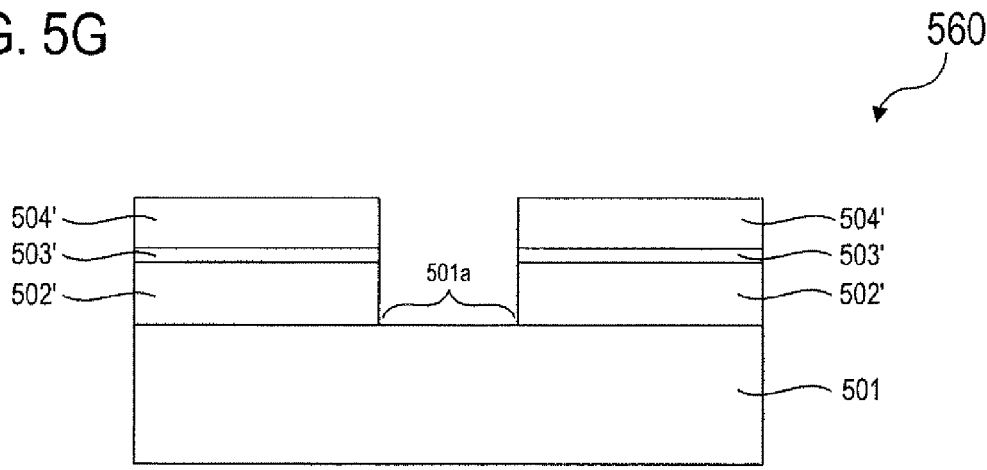

FIG. 5G shows, in a view 560, that the exposed portion 502a of the auxiliary layer 502 may be removed such that a portion 501a of the substrate 501 is exposed. In addition to the portion 501a shown in FIG. 5G, at least one additional portion of the substrate 501 may be exposed in accordance with some embodiments (not shown).

In accordance with various embodiments, removing the exposed portion 502a of the auxiliary layer 502 may include or may be achieved by etching the exposed portion 502a of the auxiliary layer 502 using the patterned plasma etch mask layer 503' and the patterned mask layer 504' as a mask.

Etching the exposed portion 502a of the auxiliary layer 502 may be achieved by means of a suitable etch process, for example a dry etch process (e.g. a plasma etch process) in accordance with various embodiments, using a suitable etchant or suitable etchants (e.g. a suitable etch gas or plasma). In general, suitable etch processes and corresponding operating conditions as such may be known in the art and may be chosen, for example, according to the material or materials to be etched (i.e. the material or materials of the auxiliary layer 502 in this case).

As shown, removing the exposed portion 502a of the auxiliary layer 502 may result in a layer stack including a patterned auxiliary layer 502', the patterned plasma etch mask layer 503' disposed on the patterned auxiliary layer 502' and the patterned mask layer 504' disposed on the patterned plasma etch mask layer 503'.

Figure 5H:
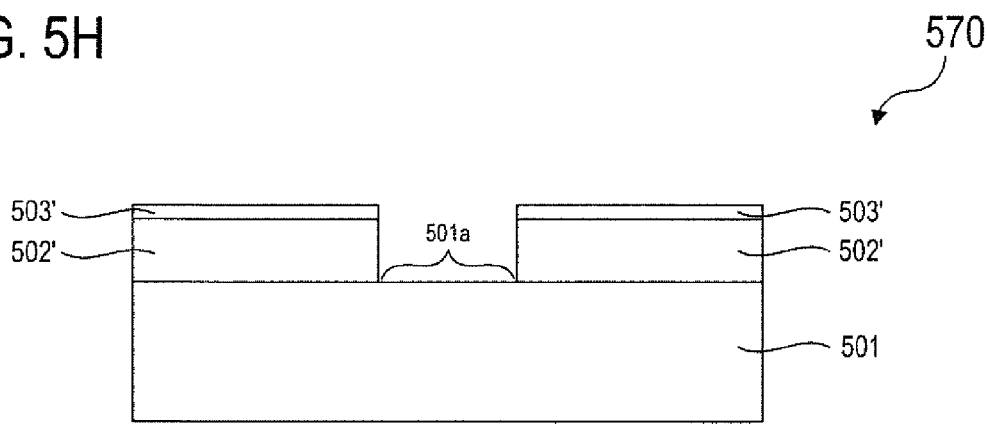

FIG. 5H shows, in a view 570, that the patterned mask layer 504' may be removed.

In accordance with various embodiments, removing the patterned mask layer 504' may include or may be achieved by means of etching the patterned mask layer 504'.

Etching the patterned mask layer 504' may be achieved by means of a suitable etch process, e.g. a wet etch process using suitable etch chemistry or a dry etch process, e.g. a plasma etch process (e.g. an ashing process) in accordance with an embodiment. In general, suitable etch processes and corresponding operating conditions as such may be known in the art and may be chosen, for example, according to the material or materials to be etched (i.e. the material or materials of the patterned mask layer 504' in this case).

In accordance with the embodiment shown in FIG. 5E to 5H, the patterned mask layer 504' will be removed only after patterning the auxiliary layer 502. That is, in accordance with this embodiment, the patterned mask layer 504' may serve as a mask when patterning the plasma etch mask layer 503 (as shown in FIG. 5E and FIG. 5F) and may also serve as a mask (together with the patterned plasma etch mask layer 503') when patterning the auxiliary layer 502 (as shown in FIG. 5F and FIG. 5G). In accordance with an alternative embodiment, the patterned mask layer 504' may be removed after patterning the plasma etch mask layer 503 and before patterning the auxiliary layer 502. That is, in accordance with this embodiment, the patterned mask layer 504' may serve as a mask only when patterning the plasma etch mask layer 503 (as shown in FIG. 5E and FIG. 5F), while patterning the auxiliary layer 502 may be achieved using only the patterned plasma etch mask layer 503' as a mask.

Figure 5I:
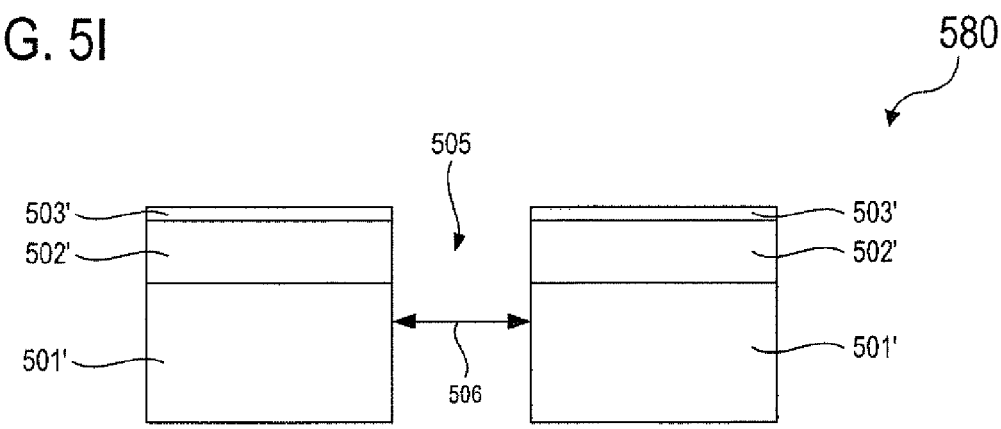

FIG. 5I shows, in a view 580, that the substrate 501 may be patterned by means of a plasma etch process using the patterned plasma etch mask layer 503' as a plasma etch mask.

Patterning the substrate 501 may include or may be achieved by means of a suitable plasma etch process using e.g. a suitable plasma etchant or suitable plasma etchants (e.g. etch gas(es) or etch plasma(s)) and/or suitable operating conditions (e.g. suitable process chamber or reactor (e.g. ICP (inductively coupled plasma) reactor, ECR (electron cyclotron resonance) reactor, TCP (transformer coupled plasma) reactor, M0RI (M=0 resonant inductance) reactor, or other suitable process chamber or reactor), temperature, partial pressures of etch gases, high frequency or microwave frequency used for plasma ignition, etc.). For example, in accordance with an embodiment, one or more fluorine-based etchants such as e.g. $SF_6$, $CF_4$ or $NF_3$ may be used for etching, possibly in combination with addition of one or more process gases that may, for example, increase volatility of the etch products and/or have a sputter effect, such as e.g. oxygen ($O_2$) or argon (Ar). Alternatively or in addition, other process gases may be used, as will be readily understood by those skilled in the art. In general, suitable plasma etch processes and corresponding operating conditions as such may be known in the art and may be chosen, for example, according to the material or materials to be etched (i.e. the material or materials of the substrate 501 in this case).

In accordance with the embodiment shown, the exposed portion 501a of the substrate 501 may be removed by the plasma etch process. As shown, removing the exposed portion 501a of the substrate 501 may result in a layer stack including a patterned substrate 501', the patterned auxiliary layer 502' disposed on the patterned substrate 501' and the patterned plasma etch mask layer 503' disposed on the patterned auxiliary layer 502'.

In accordance with the embodiment shown the substrate 501 may be patterned such that the patterned substrate 501' includes a kerf 505, as shown. Alternatively or in addition the substrate 501 may be patterned such that the patterned substrate 501' includes one or more trenches or grooves and/or one or more holes or vias (not shown, see e.g. FIG. 7).

The kerf 505 may have a kerf width, as illustrated by the arrow 506 in FIG. 5I. The kerf width 506 may correspond to a width of the patterned plasma etch mask layer 503' and the patterned auxiliary layer 502', as shown. In accordance with various embodiments, the kerf width 506 may, for example, be equal to or less than about 100 μm, for example in the range from about 1 μm to about 100 μm in accordance with an embodiment, for example in the range from about 1 μm to about 50 μm in accordance with an embodiment, for example in the range from about 1 μm to about 20 μm in accordance with an embodiment. In accordance with other embodiments, the kerf width may have a different value, e.g. greater than 100 μm or less than 1 μm.

In accordance with various embodiments, the patterned substrate 501' may include one or more additional kerfs (not shown). Clearly, in accordance with various embodiments, the patterned substrate 501' may include one or more singulated dies separated by kerfs (not shown, see e.g. FIG. 6B).

Figure 5J:
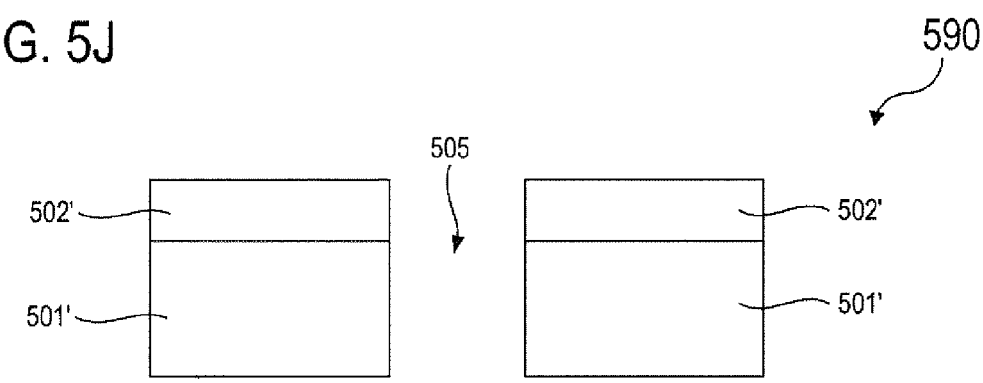
Figure 5K:
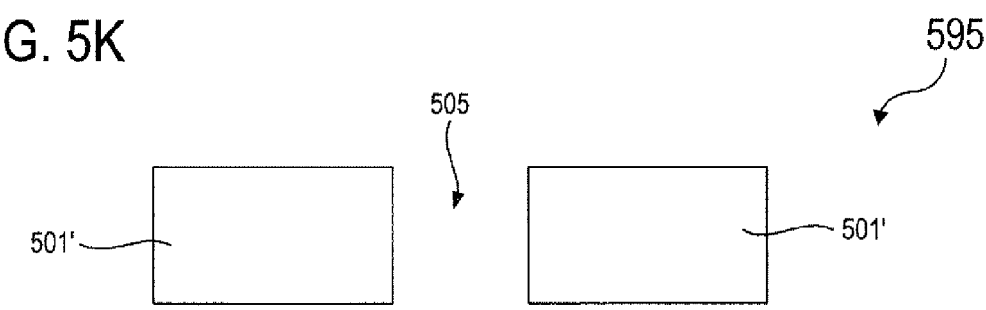

FIG. 5J and FIG. 5K show that the patterned plasma etch mask layer 503' and the patterned auxiliary layer 502' may be removed after patterning the substrate 501.

FIG. 5J shows, in a view 590, that the patterned plasma etch mask layer 503' may be removed.

In accordance with various embodiments, the patterned plasma etch mask layer 503' may be removed using an etch process, for example a wet chemical etch process or a dry etch process in accordance with an embodiment, for example a plasma etch process in accordance with an embodiment, alternatively other suitable etch processes may be used. In general, suitable etch processes and corresponding operating conditions as such may be known in the art and may be chosen, for example, according to the material or materials to be etched (i.e. the material or materials of the patterned plasma etch mask layer 503' in this case).

FIG. 5K shows, in a view 595, that the patterned auxiliary layer 502' may be removed.

In accordance with various embodiments, the patterned auxiliary layer 502' may be removed using an etch process, for example a wet chemical etch process or a dry etch process in accordance with an embodiment, for example a plasma etch process in accordance with an embodiment, alternatively other suitable etch processes may be used. In general, suitable etch processes and corresponding operating conditions as such may be known in the art and may be chosen, for example, according to the material or materials to be etched (i.e. the material or materials of the patterned auxiliary layer 502' in this case).

In accordance with the embodiment shown, the patterned plasma etch mask layer 503' and the patterned auxiliary layer 502' may be removed in separate (e.g. consecutive) process steps.

In an alternative embodiment, the patterned plasma etch mask layer 503' and the patterned auxiliary layer 502' may be removed in a single process step (for example, a lift-off process). In other words, the intermediate stage shown in FIG. 5J may not be present in this embodiment.

It has to be noted that, in accordance with some embodiments, it may be possible that the patterned mask layer 504' will be consumed (and hence removed) during the etch process used for patterning the auxiliary layer 502 (described above in connection with FIG. 5G). In other words, etching the exposed portion 502a of the auxiliary layer 502 may result in the patterned auxiliary layer 502' and, at the same time, in the removal of the patterned mask layer 504'. Thus, a dedicated removal step (e.g. dedicated etch step) for removing the patterned mask layer 504' (as described above in connection with FIG. 5H) may not be needed in this case.

Furthermore, in accordance with some embodiments, it may be possible that the patterned mask layer 504' will be consumed (and hence removed) during the etch process used for patterning the plasma etch mask layer 503 (described above in connection with FIG. 5F). In other words, etching the exposed portion 503a of the plasma etch mask layer 503 may result in the patterned plasma etch mask layer 503' and, at the same time, in the removal of the patterned mask layer 504'. Thus, a dedicated removal step (e.g. dedicated etch step) for removing the patterned mask layer 504' (as described above in connection with FIG. 5H) may not be needed in this case, and the patterned plasma etch mask layer 503' may first serve as a mask for patterning of the auxiliary layer 502 and then for patterning of the substrate 501.

Figure 6A:
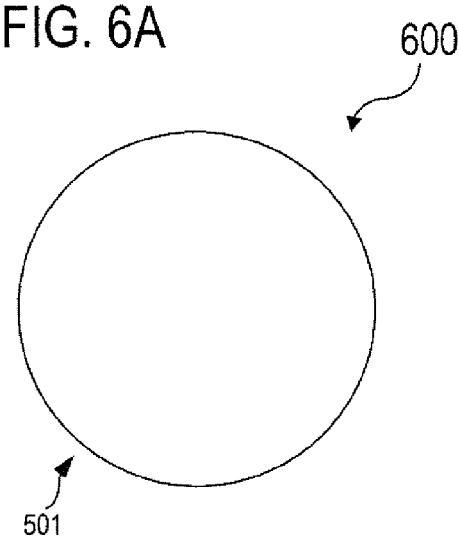
FIG. 6A and FIG. 6B show schematic plan views illustrating a method of patterning a substrate in accordance with an embodiment.
Figure 6B:
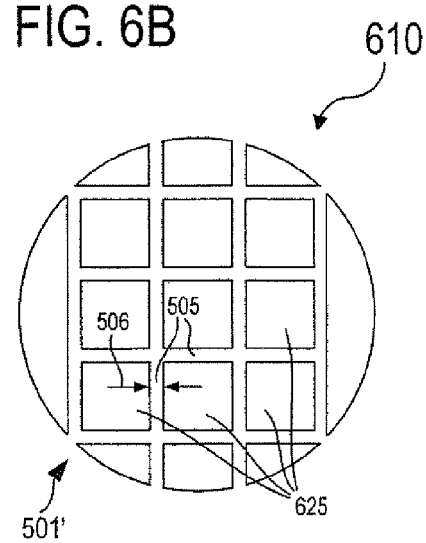

FIG. 6A and FIG. 6B show schematic plan views illustrating a method of patterning a substrate in accordance with an embodiment.

FIG. 6A shows, in a plan view 600, that a substrate 501 may be provided. The substrate 501 may be configured as a wafer, as shown. In accordance with an embodiment, the substrate 501 may be a SiC wafer. Alternatively the substrate 501 may contain or may be made of other materials, as described herein in connection with various embodiments. The substrate 501, i.e. wafer in accordance with the embodiment shown, may further be configured in accordance with one or more embodiments described herein. In accordance with some embodiments, the substrate 501 (wafer) may, for example, be mounted on a carrier, e.g. on another wafer or on a tape in accordance with some embodiments, alternatively another suitable carrier.

FIG. 6B shows, in a plan view 610, that the substrate 501 (wafer) may be patterned using a method of patterning a substrate in accordance with one or more embodiments described herein such that a patterned substrate 501' may be obtained. As shown, the patterned substrate 501' may include a plurality of dies 625 that may be separated by thin kerfs 505. The kerfs 505 may, for example, have a kerf width 506 of less than or equal to about 100 µm in accordance with some embodiments, e.g. in the range from about 1 µm to about 100 µm in accordance with an embodiment, e.g. in the range from about 1 µm to about 50 µm in accordance with an embodiment, e.g. in the range from about 1 µm to about 20 µm in accordance with an embodiment, although other values of the kerf width 506 may be possible as well in accordance with other embodiments.

Clearly, by using a method of patterning a substrate in accordance with one or more embodiments described herein, the substrate 501 may be diced into a plurality of singulated dies 625 separated by thin kerfs 505. The kerfs 505 may be obtained by plasma etching the substrate 501 using a patterned plasma etch mask layer as a plasma etch mask, as described herein. For example, in accordance with various embodiments, the plasma etch mask layer may contain or may be made of a material (e.g. a metal such as Cu and/or Ni) that may have a high etch selectivity (e.g. at least 10:1 in accordance with an embodiment) with respect to the material of the substrate 501, as described herein. As also described herein, an auxiliary layer may be interposed between the substrate 501 and the plasma etch mask layer. In accordance with various embodiments, the auxiliary layer may contain or may be made of a material (e.g. carbon) that may be patterned easily and/or may be removed easily from the substrate 501 after the substrate 501 has been patterned. In this way, it may be possible to remove the auxiliary layer and the actual plasma etch mask (i.e. the patterned plasma etch mask layer) from the patterned substrate without leaving residues on the substrate, as described herein.

Clearly, FIG. 6A and FIG. 6B show that a substrate 501 may be plasma diced using a method of patterning a substrate in accordance with various embodiments described herein such that a plurality of dies 625 may be obtained. As shown, plasma dicing may result in a separation of the dies 625 (or chips) on a common substrate wafer (i.e. substrate 501) by parallel processing, i.e. all dies (or chips) on a wafer (i.e. substrate 501) may be separated simultaneously from each other. Plasma dicing may, for example, avoid the formation of chip cracks, which may be a typical damage pattern resulting from mechanical dicing e.g. by sawing, as described herein above.

Figure 7:
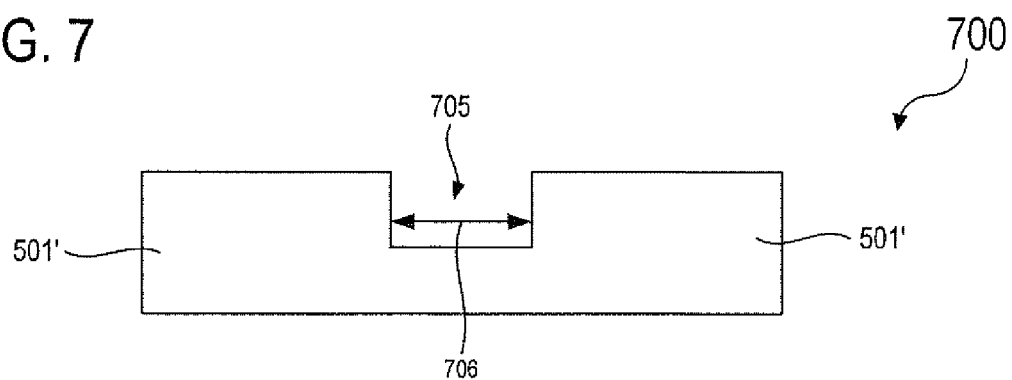
FIG. 7 shows a patterned substrate in accordance with an embodiment.

FIG. 7 shows, in a view 700, a patterned substrate 501' in accordance with another embodiment. As shown, the patterned substrate 501' may include a trench 705 (additional trenches may be present in accordance with other embodiments, not shown). The patterned substrate 501' may have been obtained by applying a method of patterning a substrate in accordance with one or more embodiments described herein (for example, similar to the embodiment described in connection with FIGS. 5A to 5K) to a substrate. The trench 705 (and/or the additional trenches) may have a lateral width 706 that may, for example, have a value in accordance with one or more embodiments described herein, for example less than or equal to about 100 µm in accordance with some embodiments, e.g. in the range from about 1 µm to about 100 µm in accordance with an embodiment, e.g. in the range from about 1 µm to about 50 µm in accordance with an embodiment, e.g. in the range from about 1 µm to about 20 µm in accordance with an embodiment, although other values of the lateral width 706 may be possible as well in accordance with other embodiments. In accordance with various embodiments, a depth of the trench 705 may have any value less than the thickness of the substrate.

In the following, exemplary features and potential effects of exemplary embodiments described herein are discussed.

In accordance with various embodiments described herein, methods for patterning wide band gap material substrates such as silicon carbide (SiC) substrates, aluminum oxide (Al$_2$O$_3$) substrates (e.g. sapphire substrates or ruby substrates), diamond substrates, wide band gap III-V semiconductor substrates, wide band gap II-VI semiconductor substrates, etc., by means of plasma etching may be provided. Patterning the substrate may, for example, include forming structures such as e.g. trenches, grooves, holes, vias, etc. in the substrate. In accordance with various embodiments, the substrate (e.g. wafer) may be diced. That is, in accordance with various embodiments, methods for plasma dicing one or more of the aforementioned substrates may be provided.

In accordance with various embodiments, plasma etching of the substrate may be carried out with the aid of a patterned plasma etch mask. The plasma etch mask may contain or may be made of a material that may have a sufficiently high etch selectivity with respect to the substrate material, e.g. an etch selectivity of at least 10:1, although other values may be possible as well. For example, in accordance with some embodiments, the plasma etch mask material may contain or may be a metal such as e.g. copper or nickel, although other materials may be possible as well.

In accordance with various embodiments, the plasma etch mask layer may be disposed on or above an auxiliary layer. That is, an auxiliary layer may be interposed between the substrate and the actual plasma etch mask. In accordance with various embodiments, the auxiliary layer may contain or may be made of a material that may be patterned easily and/or may be removed easily from the substrate. For example, in accordance with some embodiments, the auxiliary layer may contain or may be made of carbon or an organic material containing carbon such as e.g. an imide material (e.g. polyimide material), an organic resist material (e.g. organic photoresist), polytetrafluoroethylene (PTFE) or other suitable organic materials, or a porous dielectric material or a zeolite material in accordance with some embodiments.

In accordance with various embodiments, as the actual plasma etch mask layer (i.e. the actual plasma etch mask) may be disposed on or above the auxiliary layer, both the plasma etch mask layer and the auxiliary layer may be removed from the substrate without leaving residues on the substrate.

In particular, in accordance with various embodiments, by means of the auxiliary layer disposed between the substrate and the plasma etch mask layer it may be avoided that residues of the plasma etch mask material (e.g. metal such as Cu, Ni, etc.) remain on or in the substrate surface. For example, if the plasma etch mask were disposed directly on the substrate it might be possible that during plasma etching of the substrate, material of the plasma etch mask would be implanted into the substrate. In this case it would be difficult and/or costly to remove this implanted material from the substrate, so that it would be difficult and/or costly to completely remove the plasma etch mask from the substrate. By means of the auxiliary layer disposed between the substrate and the plasma etch mask, implanting of material of the plasma etch mask into the substrate may be avoided in accordance with various embodiments.

In accordance with various embodiments, the plasma etch mask layer and the auxiliary layer may be removed from the substrate after patterning (e.g. dicing) the substrate, for example in separate process steps (e.g. separate etching steps) in accordance with some embodiments, or in a single process step (e.g. a lift-off process step) in accordance with other embodiments.

In accordance with various embodiments, methods of patterning a substrate may be provided where chipping may be avoided. Thus, patterned substrates (e.g. wafers) having patterns or structures (e.g. trenches, grooves, holes, vias or kerfs) with smoother side walls may be obtained.

Various embodiments described herein may allow for plasma dicing of wide band gap material substrates such as silicon carbide (SiC) substrates. Plasma dicing may result in a separation of the dies (or chips) on a common substrate wafer by parallel processing, i.e. all dies (or chips) on a wafer may be separated simultaneously from each other. Furthermore, plasma dicing may avoid the formation of chip cracks, which may be a typical damage pattern resulting from mechanical dicing by e.g. sawing. Furthermore, kerf widths obtained by plasma dicing may be thinner than those obtained by mechanical sawing.

A method of patterning a substrate in accordance with an embodiment may include: forming an auxiliary layer on or above a substrate and forming a plasma etch mask layer on or above the auxiliary layer, wherein the auxiliary layer is configured such that it may be removed from the substrate more easily than the plasma etch mask layer; patterning the plasma etch mask layer and the auxiliary layer such that at least a portion of the substrate is exposed; patterning the substrate by means of a plasma etch process using the patterned plasma etch mask layer as a plasma etch mask.

In an example of this embodiment, the substrate may contain or may be made of a wide band gap material.

In a further example of this embodiment, the substrate may be selected from a group of substrates consisting of: a silicon carbide substrate; an aluminum oxide substrate; a diamond substrate; a II-VI semiconductor substrate; a III-V semiconductor substrate.

In a further example of this embodiment, the plasma etch mask layer may contain or may be made of a material that has a high etch selectivity with respect to a material of the substrate. For example, the plasma etch mask layer may contain or may be made of a material that has an etch selectivity of at least 10:1 with respect to a material of the substrate.

In a further example of this embodiment, the plasma etch mask layer may contain or may be made of metal, e.g. copper (Cu) and/or nickel (Ni).

In a further example of this embodiment, the auxiliary layer may contain or may be made of carbon or an organic material containing carbon.

In a further example of this embodiment, the auxiliary layer may be a carbon layer.

In a further example of this embodiment, the auxiliary layer may contain or may be made of at least one material selected from a group of materials consisting of: a resist material; an imide material (e.g. a polyimide material); polytetrafluoroethylene (PTFE); a porous dielectric material; a zeolite material.

In a further example of this embodiment, patterning the substrate may include forming at least one of the following structures in the substrate: a trench; a groove; a hole; a via.

In a further example of this embodiment, patterning the substrate may include dicing the substrate.

In a further example of this embodiment, patterning the plasma etch mask layer and the auxiliary layer may include: forming a mask layer on or above the plasma etch mask layer; patterning the mask layer such that at least one portion of the plasma etch mask layer is exposed; removing the at least one exposed portion of the plasma etch mask layer such that at least one portion of the auxiliary layer is exposed; removing the at least one exposed portion of the auxiliary layer such that the at least one portion of the substrate is exposed; removing the patterned mask layer.

In a further example of this embodiment, patterning the plasma etch mask layer and the auxiliary layer may include: forming a mask layer on or above the plasma etch mask layer; patterning the mask layer such that at least one portion of the plasma etch mask layer is exposed; removing the at least one exposed portion of the plasma etch mask layer such that at least one portion of the auxiliary layer is exposed; removing the patterned mask layer; removing the at least one exposed portion of the auxiliary layer such that the at least one portion of the substrate is exposed.

In a further example of this embodiment, forming the auxiliary layer on or above the substrate may include forming the auxiliary layer on or above a back side of the substrate.

In a further example of this embodiment, the patterned plasma etch mask layer and the patterned auxiliary layer may be removed after patterning the substrate. The patterned plasma etch mask layer and the patterned auxiliary layer may, for example, be removed using separate process steps. Alternatively, the patterned plasma etch mask layer and the patterned auxiliary layer may be removed in a single process step. For example, in an example, the patterned plasma etch mask layer and the patterned auxiliary layer may be removed using a lift-off process.

A method of patterning a substrate in accordance with another embodiment may include: forming an auxiliary layer on or above a substrate, wherein the substrate contains or is made of silicon carbide and the auxiliary layer contains carbon or an organic material contains carbon; forming a plasma etch mask layer on or above the auxiliary layer, wherein the plasma etch mask layer comprises metal; patterning the plasma etch mask layer and the auxiliary layer such that at least a part of the substrate is exposed; patterning the substrate by means of a plasma etch process using the patterned plasma etch mask layer as a plasma etch mask.

In an example of this embodiment, the auxiliary layer may be a carbon layer.

In a further example of this embodiment, the metal may contain or may be copper and/or nickel.

In a further example of this embodiment, patterning the substrate may include dicing the substrate.

A method of patterning a substrate in accordance with another embodiment may include: forming a carbon layer on or above a silicon carbide substrate; forming a metal layer on or above the carbon layer; patterning the metal layer and the carbon layer such that at least a part of the silicon carbide substrate is exposed; plasma etching the silicon carbide substrate using the patterned metal layer as a plasma etch mask.

In an example of this embodiment, the silicon carbide substrate may be diced by means of the plasma etching.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of patterning a substrate, the method comprising:
    forming an auxiliary layer on or above a substrate and forming a plasma etch mask layer on or above the auxiliary layer, wherein the auxiliary layer is configured such that it may be removed from the substrate more easily than the plasma etch mask layer;
    patterning the plasma etch mask layer and the auxiliary layer such that at least a portion of the substrate is exposed; and
    patterning the substrate by means of a plasma etch process using the patterned plasma etch mask layer as a plasma etch mask, wherein the substrate is selected from a group of substrates consisting of a silicon carbide substrate, an aluminum oxide substrate, a diamond substrate, a I-VI semiconductor substrate, and a III-V semiconductor substrate.

2. The method of claim 1, wherein the substrate comprises a wide band gap material.

3. The method of claim 1, wherein the plasma etch mask layer comprises a material that has a high etch selectivity with respect to a material of the substrate.

4. The method of claim 3, wherein the plasma etch mask layer comprises a material that has an etch selectivity of at least 10:1 with respect to a material of the substrate.

5. The method of claim 1, wherein the plasma etch mask layer comprises metal.

6. The method of claim 5, wherein the metal comprises at least one of:
    copper; or
    nickel.

7. The method of claim 1, wherein the auxiliary layer comprises carbon or an organic material comprising carbon.

8. The method of claim 1, wherein the auxiliary layer is carbon layer.

9. The method of claim 1, wherein the auxiliary layer comprises at least one material selected from a group of materials consisting of:
    a resist material;
    an imide material;
    polytetrafluoroethylene;
    a porous dielectric material; and
    a zeolite material.

10. The method of claim 1, wherein patterning the substrate comprises forming at least one of the following structures in the substrate:
    a trench;
    a groove;
    a hole; or
    a via.

11. The method of claim 1, wherein patterning the substrate comprising dicing the substrate.

12. The method of claim 1, wherein patterning the plasma etch mask layer and the auxiliary layer comprises:
    forming a mask layer on or above the plasma etch mask layer;
    patterning the mask layer such that at least one portion of the plasma etch mask layer is exposed;
    removing the at least one exposed portion of the plasma etch mask layer such that at least one portion of the auxiliary layer is exposed;
    removing the at least one exposed portion of the auxiliary layer such that the at least one portion of the substrate is exposed; and
    removing the patterned mask layer.

13. The method of claim 1, wherein patterning the plasma etch mask layer and the auxiliary layer comprises:
    forming a mask layer on or above the plasma etch mask layer;
    patterning the mask layer such that at least one portion of the plasma etch mask layer is exposed;
    removing the at least one exposed portion of the plasma etch mask layer such that at least one portion of the auxiliary layer is exposed;
    removing the patterned mask layer; and
    removing the at least one exposed portion of the auxiliary layer such that the at least one portion of the substrate is exposed.

14. The method of claim 1, wherein forming the auxiliary layer on or above the substrate comprises forming the auxiliary layer on or above the back side of the substrate.

15. The method of claim 1, further comprising removing the patterned plasma etch mask layer and the patterned auxiliary layer after patterning the substrate.

16. The method of claim 15, wherein the patterned plasma etch mask layer and the patterned auxiliary are removed using separate process steps.

17. The method of claim 15, wherein the patterned plasma etch mask layer and the patterned auxiliary layer are removed in a single process step.

18. The method of claim 17, wherein the patterned plasma etch mask layer and the patterned auxiliary layer are removed using a lift-off process.

19. A method of patterning a substrate, the method comprising:
    forming an auxiliary layer on or above a substrate, wherein the substrate comprises silicon carbide and the auxiliary layer comprises carbon or an organic material comprising carbon;
    forming a plasma etch mask layer on or above the auxiliary layer, wherein the plasma etch mask layer comprises metal;
    patterning the plasma etch mask layer and the auxiliary layer such that at least a part of the substrate is exposed; and
    patterning the substrate by means of a plasma etch process using the patterned plasma etch mask layer as a plasma etch mask.

20. The method of claim 19, wherein the auxiliary layer is a carbon layer.

21. The method of claim 19, wherein patterning the substrate comprises dicing the substrate.

22. A method of patterning a substrate, the method comprising:
    forming a carbon layer on or above a silicon carbide substrate;
    forming a metal layer on or above the carbon layer;
    patterning the metal layer and the carbon layer such that at least part of the silicon carbide substrate is exposed; and
    plasma etching the silicon carbide substrate using the patterned metal layer as a plasma etch mask.

23. The method of claim 22, wherein the silicon carbide substrate is diced by means of the plasma etching.

24. The method of claim 22, further comprising removing the patterned metal layer and the patterned carbon layer after plasma etching the silicon carbide substrate.

* * * * *